(12) United States Patent
Tie et al.

(10) Patent No.: US 11,009,528 B2
(45) Date of Patent: May 18, 2021

(54) SYSTEM FOR MEASURING CATHODE CURRENT

(71) Applicant: NORTH CHINA UNIVERSITY OF TECHNOLOGY, Beijing (CN)

(72) Inventors: Jun Tie, Beijing (CN); Rentao Zhao, Beijing (CN); Zhifang Zhang, Beijing (CN); Wentang Zheng, Beijing (CN)

(73) Assignee: North China University of Technology, Beijing (CN)

( * ) Notice: Subject to any disclaimer, the term of this patent is extended or adjusted under 35 U.S.C. 154(b) by 174 days.

(21) Appl. No.: 16/461,904

(22) PCT Filed: Jun. 27, 2018

(86) PCT No.: PCT/CN2018/093021
§ 371 (c)(1),
(2) Date: May 17, 2019

(87) PCT Pub. No.: WO2019/174153
PCT Pub. Date: Sep. 19, 2019

(65) Prior Publication Data
US 2020/0271697 A1     Aug. 27, 2020

(30) Foreign Application Priority Data

Mar. 15, 2018 (CN) .......................... 201810213555.2

(51) Int. Cl.
*G01R 15/24* (2006.01)
*G01R 15/20* (2006.01)
*G01R 19/00* (2006.01)

(52) U.S. Cl.
CPC .......... *G01R 15/24* (2013.01); *G01R 15/202* (2013.01); *G01R 19/0092* (2013.01)

(58) Field of Classification Search
None
See application file for complete search history.

(56) References Cited

U.S. PATENT DOCUMENTS

| 6,406,610 B1 * | 6/2002 | Lowe ...................... B21J 13/14 |
| | | 204/198 |
| 6,495,018 B1 * | 12/2002 | Lowe ...................... C25D 5/02 |
| | | 204/228.1 |
| 8,123,917 B2 * | 2/2012 | Dufresne .................. C25C 7/00 |
| | | 204/297.01 |
| 2013/0328436 A1 * | 12/2013 | Oshida ................ H02K 17/165 |
| | | 310/211 |

* cited by examiner

*Primary Examiner* — Jermele M Hollington
(74) *Attorney, Agent, or Firm* — Avant Law Group, LLC

(57) ABSTRACT

A system for measuring a cathode current includes a conducting bar and a current measuring device. The conducting bar has a rectangular plate-like structure, and a first end of the conducting bar is vertically cut to form a plurality of long teeth. The plurality of long teeth are equally spaced at the first end of the conducting bar. The number of the plurality of long teeth is equal to the number of cathodes. The upper surface of each of the long teeth may include a raised conductive contact. Each of the conductive contacts is connected with one cathode of an upstream slot. A second end of the conducting bar is connected with a downstream slot, and the second end of the conducting bar is one end opposite to the first end. The current measuring device is disposed on the conducting bar and used for measuring the current of each cathode.

8 Claims, 3 Drawing Sheets

SYSTEM FOR MEASURING CATHODE CURRENT

CROSS REFERENCE TO RELATED APPLICATIONS

This application claims priority to PCT application PCT/CN2018/093021 filed Jun. 27, 2018, which claims priority to Chinese application number 201810213555.2 filed Mar. 15, 2018; the disclosure each is incorporated herein in its entirety by reference.

FIELD OF THE DISCLOSURE

The disclosure relates generally to the field of aqueous solution electrolysis. More specifically, the disclosure relates to the field of a system for measuring a cathode current.

BACKGROUND

In industrial production processes such as aqueous solution electrorefining and electrolytic deposition of copper, a single electrolytic cell contains about 50 anodes and a corresponding number of cathodes. The anode and the cathode of the electrolytic cell are each in a plate shape and are called an anode plate and a cathode plate, with the area of each single face being 1 $m^2$ or more. The single electrode allows a current of 500 A or more to pass, and the anode plates and the cathode plates are cross side by side. Due to a narrow space between the anode and cathode on the electrolytic cell and an electrode distance of dozens of millimeters, local deformation on the electrode surface may cause uneven distribution of a current on the electrode surface, resulting in an increase in local current density; proportion or component disorder of additives in the electrolytic process causes the surface to form dendrites; for the anode used for refining, some components and apparent quality exceed the requirements, resulting in the formation of agglomerates on the surface of the corresponding cathode. The occurrence of these conditions will cause localized formation of the agglomerates on the surface of the cathode and the agglomerates will gradually grow into coarse particles. When the particles are in contact with the surface of the anode, a short circuit is formed between the cathode and the anode. At this time, the cathode current reaches a maximum which is three times the average current, resulting in a current efficiency loss of 2-4% or above, which, at the same time, also reduces the cathode quality and even causes serious situations such as burning and deformation of the cathode plate and a current conducting rod.

In addition, the cathode plate is in lap joint with a conducting bar of the electrolytic cell through the current conducting rod, and the contact connection between the current conducting rod and the conducting bar is achieved by the self-weight of the cathode. When contacts on a copper bar are not cleaned inadequately, the increase in the contact resistance is caused easily, and the cathode current is greatly reduced, resulting in an open circuit. The occurrence of the cathodic open circuit not only reduces the copper deposited on the cathode and increases the current electrolytic around, but also makes the reverse dissolution of the cathode copper occur in an open circuit state of no current, to form a "cold burnt plate".

In order to reduce the dispersion of the current density distribution between the cathodes and reduce the product quality loss caused by the large current efficiency loss resulting from the short-circuit current, some literatures have proposed a separate inter-cell conducting bar structure. Through the change of a connection structure of the conducting bar, a conventional potential-controlled electrode connection mode is converted into a current-controlled electrode connection mode, which greatly reduces the dispersion of the current density distribution between the cathodes, reduces the maximum short-circuit current from three time the average current to 1.5 times the average current, and also reduces the incidence of the short circuit. However, such a conducting bar needs to be processed in a specific shape, and enterprises need to increase the processing costs of more novel copper bars during the reconstruction. In addition, an inclined structure of the conducting bar also requires a base to be subjected to special-shaped processing, which increases the investment cost. Moreover, in the cathode/anode pair voltage drop measurement, linear trend analysis is performed by using long-term voltage change information to diagnose the short circuit and the occurrence thereof. Since cathode currents come from two working surfaces of the cathode during the actual measurement, and the magnitude of the current on each surface and variations thereof cannot be distinguished, the cathode currents cannot be measured. In the prior art, the cathode short-circuit detection of an anode-cathode pair is usually performed through voltage drop measurement. When the short circuit is detected, the short circuit has occurred for a long time and a loss has been caused. Therefore, the above detection method has retardance.

According to some embodiments, the invention proposes a system for measuring a cathode current, which may enable accurate on-line measurement of the cathode current without affecting a cell face operation slot, so that a hidden danger of a cathode short circuit may be predicted according to the measured current, and an open circuit is diagnosed.

SUMMARY

The following presents a simplified summary of the invention in order to provide a basic understanding of some aspects of the invention. This summary is not an extensive overview of the invention. It is not intended to identify critical elements or to delineate the scope of the invention. Its sole purpose is to present some concepts of the invention in a simplified form as a prelude to the more detailed description that is presented elsewhere.

In some embodiments, an objective is to provide a system for measuring a cathode current to achieve accurate measurement of the cathode current, thereby improving the accuracy and timeliness of prediction by application to a short circuit prediction based on the detected current.

According to an embodiment, a system for measuring a cathode current may include a conducting bar and a current measuring device, where the conducting bar has a rectangular plate-like structure, and a first end of the conducting bar is vertically cut to form a plurality of long teeth; the plurality of long teeth are equally spaced at the first end of the conducting bar, and the number of the plurality of long teeth is equal to the number of cathodes; the upper surface of each of the long teeth may include a raised conductive contact, and each of the conductive contacts is connected with one cathode of an upstream slot; a second end of the conducting bar is connected with a downstream slot, and the second end of the conducting bar is one end opposite to the first end; and the current measuring device is disposed on the conducting bar and used for measuring the current of each cathode.

According to another embodiment, each of the plurality of long teeth has a width of 30-100 mm and a length of 50-180 mm.

According to a further embodiment, the measuring device is a Hall element, and the Hall element is located above or below the conducting bar corresponding to the long tooth; each of the long teeth corresponds to a Hall element group, and each Hall element group may include two Hall elements; for each long tooth, the Hall element group is located on a perpendicular line which is at a central position of a conductive portion of the long tooth and is perpendicular to the upper surface of the conducting bar, and the Hall element group is not in contact with the long tooth; the distance between the two Hall elements in the Hall element group is within a set distance range, and a measured value of a current of a cathode corresponding to the long tooth is obtained by a magnetic field strength measured by the Hall element group.

According to an alternate embodiment, the distance between two Hall elements in each Hall element group is 10-30 mm; and the distance between the Hall element group and the surface of the long tooth is 10-50 mm.

In some embodiments, all of the Hall elements are packaged in a measuring box mounted at a fixed position of the upper or lower surface of the conducting bar.

In other embodiments, the measuring device is a fiber optic current sensor, and each of the long teeth corresponds to one of the fiber optic current sensors; and for each long tooth, the fiber optic current sensor is wound around the outside of the long tooth to form a closed loop, and a measured value of a current of the cathode corresponding to the long tooth is obtained by measuring a magnetic field measured by the fiber optic current sensor.

In further embodiments, the system further may include a protective sleeve, and the protective sleeve coats and protects fiber optic current sensors protruding from the upper and lower surfaces of the long tooth.

In alternate embodiments, the measuring device is a voltage measuring device, and the voltage measuring device is located on the upper or lower surface of the conducting bar; each of the long teeth corresponds to one of the voltage measuring devices, and all the voltage measuring devices are located at the same position of the corresponding long teeth; for each long tooth, a first end of the voltage measuring device is connected to a first connecting point of the long tooth close to the conductive contact, a second end of the voltage measuring device is connected to a second connecting point of the long tooth close to the conductive contact, and a measured value of a current of a cathode corresponding to the long tooth is obtained through the voltage drop between the first connecting point and the second connecting point measured by the voltage measuring device.

Some embodiments of the invention may have a novel conducting bar structure that may enable accurate on-line measurement of a cathode current without affecting a cell face operation slot, predict a hidden danger of a cathode short circuit, and timely find out whether there is a short circuit hidden danger on a cathode plate to avoid the occurrence of the cathode short circuit and eliminate current short circuit loss, thereby improving electrolysis current efficiency and product quality. The current efficiency may be improved by 2% or above, and the labor intensity of field operators may be alleviated.

BRIEF DESCRIPTION OF THE DRAWINGS

Illustrative embodiments of the present disclosure are described in detail below with reference to the accompanying drawings.

DETAILED DESCRIPTION

The described embodiments are merely some rather than all of the embodiments of the present invention. All other embodiments obtained by a person of ordinary skill in the art based on the embodiments of the present invention without creative efforts shall fall within the protection scope of the present invention.

Figure 1:
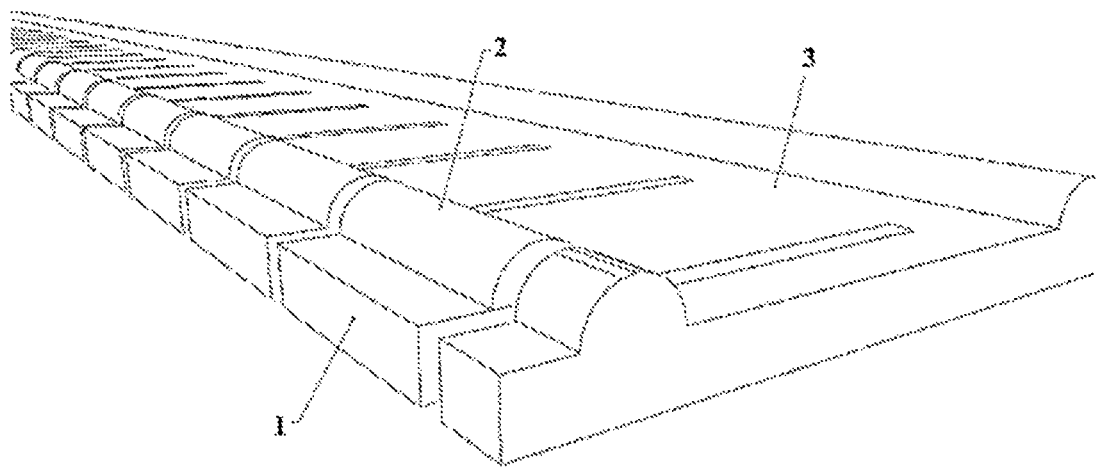
FIG. 1 is a schematic structural view of a conducting bar of a system for measuring a cathode current according to an embodiment.

FIG. 1 is a schematic structural view of a conducting bar of a system for measuring a cathode current according to an embodiment of the invention. As shown in FIG. 1, the conducting bar may have a rectangular plate-like structure, and a first end of the conducting bar is vertically cut to form a plurality of long teeth 1. The plurality of long teeth 1 are equally spaced at the first end of the conducting bar to form a long tooth type. In this case, it is to be understood that the conducting bar is composed of a matrix 3 and a plurality of long teeth 1 connected with the matrix 3. The number of the plurality of long teeth 1 is equal to the number of cathodes; the upper surface of each of the long teeth 1 may include a raised conductive contact 2, and each of the conductive contacts 2 is connected with one cathode of an upstream slot; a second end of the conducting bar is connected with a downstream slot, and the second end of the conducting bar is one end opposite to the first end. The cathode current of the upstream slot is conducted to the downstream slot through the conducting bar. When the cathode current passes through the long teeth 1, an independent current signal is formed, and the magnitude of the cathode current is obtained by measuring the signal. A current measuring device is disposed on the conducting bar and used for measuring the current of each cathode. Each of the long teeth 1 has a width of 30-100 mm and a length of 50-180 mm.

Specific parameters on the conducting bar may be determined according to the actual specifications of an electrolytic cell. For example, a copper electrolytic cell has a cathode number of 50 and an anode number of 51. The conducting bar may be designed to have a total width of 260 mm, a length of 5200 mm, and a height of 20 mm. 50 long teeth are cut from one side of the conducting bar, and each long tooth has a width of 90 mm and a length of 170 mm. The interval (tooth gap) between the long teeth 1 is 10 mm. The conductive contacts on the long teeth 1 are connected to a cathode current conducting rod, and are 20 mm from a long tooth head.

Figure 2:
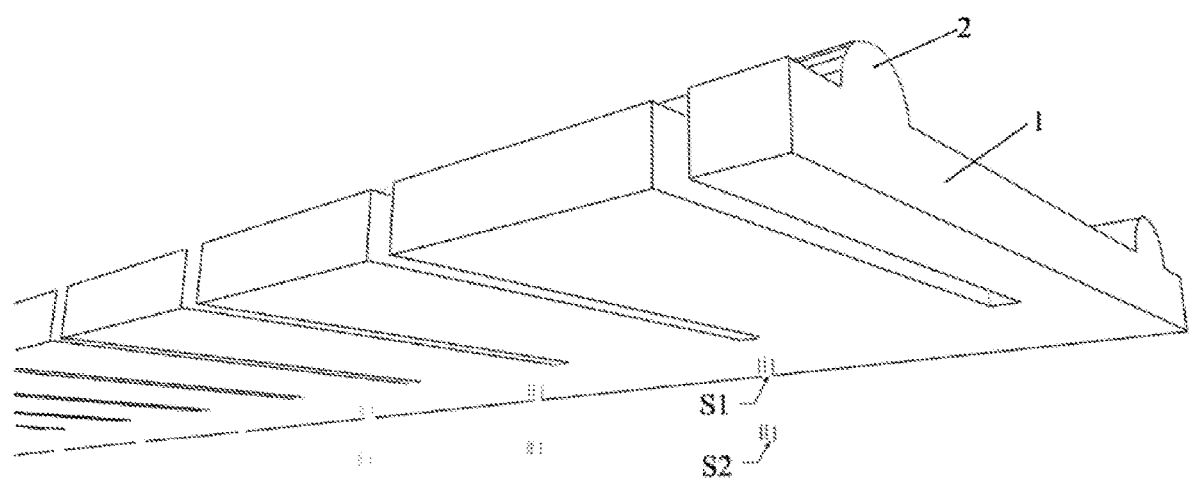
FIG. 2 is a schematic structural view of Embodiment 1 of a system for measuring a cathode current according to another embodiment.
Figure 3:
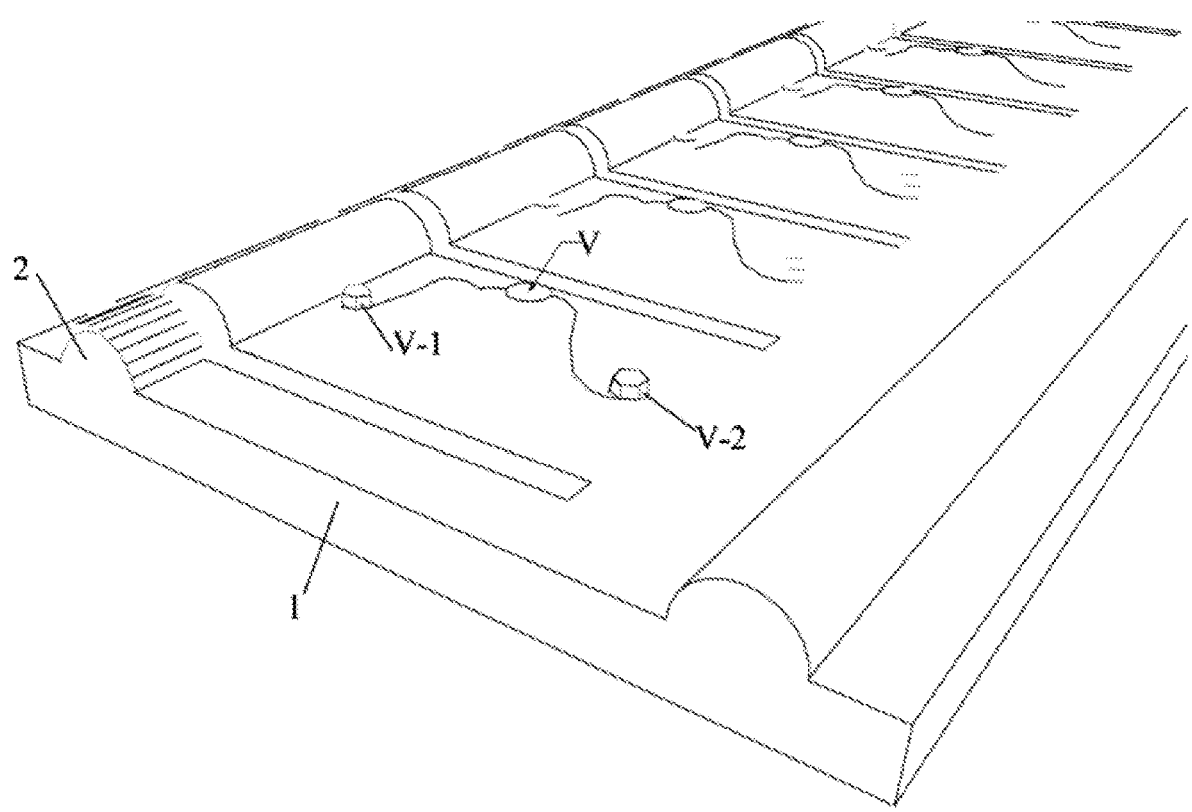
FIG. 3 is a schematic structural view of Embodiment 2 of a system for measuring a cathode current according to a further embodiment.

A system for measuring a cathode current based on the conducting bar according to another embodiment is as shown in FIG. 2 and FIG. 3.

FIG. 2 is a schematic structural view of Embodiment 1 of a system for measuring a cathode current according to another embodiment of the invention. As shown in FIG. 2, a measuring device used in this embodiment is a Hall element, and the Hall element is located above or below the conducting bar corresponding to the long tooth; each of the long teeth corresponds to a Hall element group, and each Hall element group may include two Hall elements S1 and S2; for each long tooth, the Hall element group is located on a perpendicular line which is at a central position of a conductive portion of the long tooth and is perpendicular to the upper surface of the conducting bar, and the Hall element group is not in contact with the long tooth; the distance between the two Hall elements in the Hall element group is within a set distance range, and a measured value of a current of a cathode corresponding to the long tooth is obtained by a magnetic field strength measured by the Hall element group. Usually, the distance between two Hall elements in each Hall element group is 10-30 mm; and the distance between the Hall element group and the surface of the long tooth is 10-50 mm.

The working faces of the Hall elements S1 and S2 are parallel to the long tooth direction, and the Hall element group may be placed on the upper and lower surfaces of a copper bar. As shown in FIG. 2, the Hall element group is placed on the lower surface of the copper bar. One set of elements is placed on each of the long teeth on the copper bar to measure a corresponding current. All Hall elements are packaged in a measuring box, and the measuring box is mounted at a fixed position on the upper or lower surface of the copper bar to ensure the positions of the Hall elements are fixed relative to the long tooth.

The Hall elements S1 and S2 measure magnetic field strengths $E_{i1}$ and $E_{i2}$ of the corresponding positions respectively, and the difference between the magnetic field strengths is proportional to a current $I_i$ passing through the long teeth as follows:

$$I_i = k_i(E_{i1} - E_{i2}) \quad (1)$$

In the formula (1), k is a proportional constant, and coefficients of each set of elements are calibrated before use, and the elements are installed at the production site. The coefficients are obtained by calibration with a known current. By using the Hall element group, the interference of the background magnetic field may be effectively reduced, to achieve the measurement accuracy.

FIG. 3 is a schematic structural view of Embodiment 2 of a system for measuring a cathode current according to a further embodiment of the invention. In this embodiment, the measurement is performed by an equidistant voltage drop method, and the voltage drop of a long tooth center line between a position near a cathode contact and a position near a matrix connected with a copper bar, which has a certain length distance, is measured. As shown in FIG. 3, a measuring device is a voltage measuring device V, and the voltage measuring device V is located on the upper or lower surface of the conducting bar; each of the long teeth corresponds to one of the voltage measuring devices V, and all the voltage measuring devices V are located at the same position of the corresponding long teeth; for each long tooth, a first end of the voltage measuring device is connected to a first connecting point V-1 of the long tooth close to the conductive contact, a second end of the voltage measuring device is connected to a second connecting point V-2 of the long tooth close to the conductive contact, and a measured value of a current of a cathode corresponding to the long tooth is obtained through the voltage drop between the first connecting point V-1 and the second connecting point V-2 measured by the voltage measuring device.

The positions of the first connecting point and the second connecting point are set according to actual conditions. For example, a first connecting point (namely a measurement point) is set at a position, 10 mm from the cathode contact, of a long tooth center line on the upper surface of the conducting bar, and a second connecting point (namely a measurement point) is set at a 100 mm position along the center line, and the voltage drop between the two points is measured.

The measurement of the equidistant voltage drop is performed at the same position of each long tooth, and a current $I_i$ passing through the i-th long tooth is calculated from the measured voltage drop $V_i$ between two points as follows:

$$I_i = k_i V_i \quad (2)$$

In the formula (2), $k_i$ is an equivalent resistance coefficient of a corresponding copper bar long tooth, and is calibrated by measuring the voltage drop at a known current.

In the case where an accurate series current $I_t$ is known, $I_i$ may also be calculated according to a formula (3) to further reduce an error:

$$I_i = (k_i V_i / \Sigma_{j=1}^n k_j V_j) I_t \quad (3)$$

In the formula (3), n is the number of cathodes, and is also the number of conductive long teeth on the copper bar. Equidistant voltage drop measurement points, namely the first connecting point and the second connecting point, may be on the upper or lower surface of the conducting bar. A measuring lead is packaged and fixed with a measuring box.

Embodiment 3 of the present disclosure is now described. A measuring device of this embodiment is a fiber optic current sensor, and each of the long teeth corresponds to one of the fiber optic current sensors; for each long tooth, the fiber optic current sensor is wound around the outside of the long tooth to form a closed loop, and a measured value of a current of a cathode corresponding to the long tooth is obtained by measuring a magnetic field measured by the fiber optic current sensor. In order to protect fiber optic current sensors, the fiber optic current sensors need to be protected on the upper and lower surfaces of the conducting bar. For example, the fiber optic current sensors protruding from the upper and lower surfaces of the long tooth are coated with and protected by a protective sleeve.

The above three embodiments of the present invention show that the system for measuring the cathode current may be suitable for cathode current measurement of various separate copper bars. A novel conducting bar structure may enable accurate on-line measurement of the cathode current without affecting a cell face operation slot, predict a hidden danger of a cathode short circuit, and make a diagnosis on the short circuit, to improve electrolysis current efficiency and product quality.

Embodiments of the present specification may be described in a progressive manner; each embodiment focuses on the difference from other embodiments, and the same and similar parts between the embodiments may refer to each other.

The above embodiments are provided merely for the purpose of describing the present invention and are not intended to limit the scope of the present invention. Various equivalent replacements and modifications made without departing from the spirit and scope of the present invention should fall within the scope of the present invention.

In some embodiments, the system may enable accurate on-line measurement of the cathode current without affecting a cell face operation slot, a hidden danger of a cathode short circuit is predicted, and whether there is a short circuit hidden danger on a cathode plate may be timely found out to avoid the occurrence of the cathode short circuit. In further embodiments, the system may improve electrolysis current efficiency and product quality and alleviate the labor intensity of field operators.

Many different arrangements of the various components depicted, as well as components not shown, are possible without departing from the spirit and scope of the present disclosure. Embodiments of the present disclosure have been described with the intent to be illustrative rather than restrictive. Alternative embodiments will become apparent to those skilled in the art that do not depart from its scope. A skilled artisan may develop alternative means of implementing the aforementioned improvements without departing from the scope of the present disclosure.

It will be understood that certain features and subcombinations are of utility and may be employed without reference to other features and subcombinations and are contemplated within the scope of the claims. Unless apparent, inherent, or indicated otherwise, not all steps listed in the various figures need be carried out in the specific order described.

What is claimed is:

1. A system for measuring a cathode current, the system comprising a conducting bar and a current measuring device, wherein:
    the conducting bar has a rectangular plate-like structure;
    a first end of the conducting bar is vertically cut to form a plurality of long teeth;
    the plurality of long teeth is equally spaced at the first end of the conducting bar, and the number of the plurality of long teeth is equal to the number of cathodes;
    the upper surface of each of the long teeth comprises a raised conductive contact, and each of the conductive contacts is connected with one cathode of an upstream slot;
    a second end of the conducting bar is connected with a downstream slot, and the second end of the conducting bar is opposite to the first end; and
    the current measuring device is disposed on the conducting bar and used for measuring the current of each cathode.

2. The system for measuring the cathode current according to claim 1, wherein each of the plurality of long teeth has a width of 30-100 mm and a length of 50-180 mm.

3. The system for measuring the cathode current according to claim 1, wherein:
    the measuring device is a Hall element, and the Hall element is located above or below the conducting bar corresponding to the long tooth;
    each of the long teeth corresponds to a Hall element group, and each Hall element group comprises two Hall elements; and
    for each long tooth, the Hall element group is located on a perpendicular line which is at a central position of a conductive portion of the long tooth and is perpendicular to the upper surface of the conducting bar, and the Hall element group is not in contact with the long tooth; the distance between the two Hall elements in the Hall element group is within a set distance range, and a measured value of a current of a cathode corresponding to the long tooth is obtained by a magnetic field strength measured by the Hall element group.

4. The system for measuring the cathode current according to claim 3, wherein the distance between two Hall elements in each Hall element group is 10-30 mm, and the distance between the Hall element group and the surface of the long tooth is 10-50 mm.

5. The system for measuring the cathode current according to claim 4, wherein all of the Hall elements are packaged in a measuring box mounted at a fixed position of the upper or lower surface of the conducting bar.

6. The system for measuring the cathode current according to claim 1, wherein:
    the measuring device is a fiber optic current sensor, and each of the long teeth corresponds to one of the fiber optic current sensors; and
    for each long tooth, the fiber optic current sensor is wound around the outside of the long tooth to form a closed loop, and a measured value of a current of the cathode corresponding to the long tooth is obtained by measuring a magnetic field measured by the fiber optic current sensor.

7. The system for measuring the cathode current according to claim 6, wherein the system further comprises a protective sleeve for coating and protecting fiber optic current sensors protruding from the upper and lower surfaces of the long tooth.

8. The system for measuring the cathode current according to claim 1, wherein:
    the measuring device is a voltage measuring device, and the voltage measuring device is located on the upper or lower surface of the conducting bar; each of the long teeth corresponds to one of the voltage measuring devices, and all the voltage measuring devices are located at the same position of the corresponding long teeth; and
    for each long tooth, a first end of the voltage measuring device is connected to a first connecting point of the long tooth close to the conductive contact, a second end of the voltage measuring device is connected to a second connecting point of the long tooth close to the conductive contact, and a measured value of a current of a cathode corresponding to the long tooth is obtained through the voltage drop between the first connecting point and the second connecting point measured by the voltage measuring device.

* * * * *